(12) United States Patent
Tuncer

(10) Patent No.: US 12,027,572 B2
(45) Date of Patent: Jul. 2, 2024

(54) INTEGRATED SEMICONDUCTOR DEVICE ISOLATION PACKAGE

(71) Applicant: Texas Instruments Incorporated, Dallas, TX (US)

(72) Inventor: Enis Tuncer, Dallas, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 86 days.

(21) Appl. No.: 17/491,451

(22) Filed: Sep. 30, 2021

(65) Prior Publication Data
US 2023/0094556 A1 Mar. 30, 2023

(51) Int. Cl.
*H01L 23/64* (2006.01)
*H01L 23/00* (2006.01)
*H01L 25/065* (2023.01)
*H01L 49/02* (2006.01)

(52) U.S. Cl.
CPC ............ *H01L 28/10* (2013.01); *H01L 23/645* (2013.01); *H01L 24/48* (2013.01); *H01L 25/0655* (2013.01); *H01L 2224/48177* (2013.01); *H01L 2924/1425* (2013.01)

(58) Field of Classification Search
CPC ..... H01L 24/48; H01L 25/0655; H01L 28/10; H01L 23/645
See application file for complete search history.

(56) References Cited

U.S. PATENT DOCUMENTS

| | | | | |
|---|---|---|---|---|
| 11,538,774 B2* | 12/2022 | He | .......................... | H01L 24/82 |
| 11,584,638 B2* | 2/2023 | Lacap | .................... | B81B 7/0048 |
| 11,605,602 B2* | 3/2023 | Lise | ....................... | H01F 17/043 |
| 2008/0029845 A1* | 2/2008 | Shen | ...................... | H01L 23/645 |
| | | | | 257/E21.022 |
| 2015/0069572 A1* | 3/2015 | Khanolkar | .............. | H01L 28/10 |
| | | | | 257/531 |
| 2017/0316955 A1* | 11/2017 | Tsai | ................... | H01L 23/49503 |
| 2018/0182704 A1* | 6/2018 | Yeh | ........................ | H01L 23/528 |
| 2020/0211961 A1* | 7/2020 | Khanolkar | ............ | H01F 27/288 |
| 2020/0212166 A1* | 7/2020 | Cook | ................... | H01L 23/5227 |

OTHER PUBLICATIONS

"UCC12050 High-Density, Low-EMI, 5-kVRMS Reinforced Isolation DC/DC Module", Texas Instruments Incorporated, Datasheet UCC12050, Sep. 2019—Revised Sep. 2021, accessed on Sep. 28, 2021, https://www.ti.com/lit/ds/symlink/ucc12050.pdf?ts=1632841707579&ref_url=https%253A%252F%252Fwww.mouser.com%252F.

* cited by examiner

*Primary Examiner* — Walter H Swanson
(74) *Attorney, Agent, or Firm* — Dawn Jos; Frank D. Cimino

(57) ABSTRACT

In a described example, an apparatus includes a transformer including: an isolation dielectric layer with a first surface and a second surface opposite the first surface; a first inductor formed over the first surface, the first inductor comprising a first layer of ferrite material, and a first coil at least partially covered by the first layer of ferrite material; and a second inductor formed over the second surface, the second inductor comprising a second layer of ferrite material and a second coil at least partially covered by the second layer of ferrite material.

16 Claims, 8 Drawing Sheets

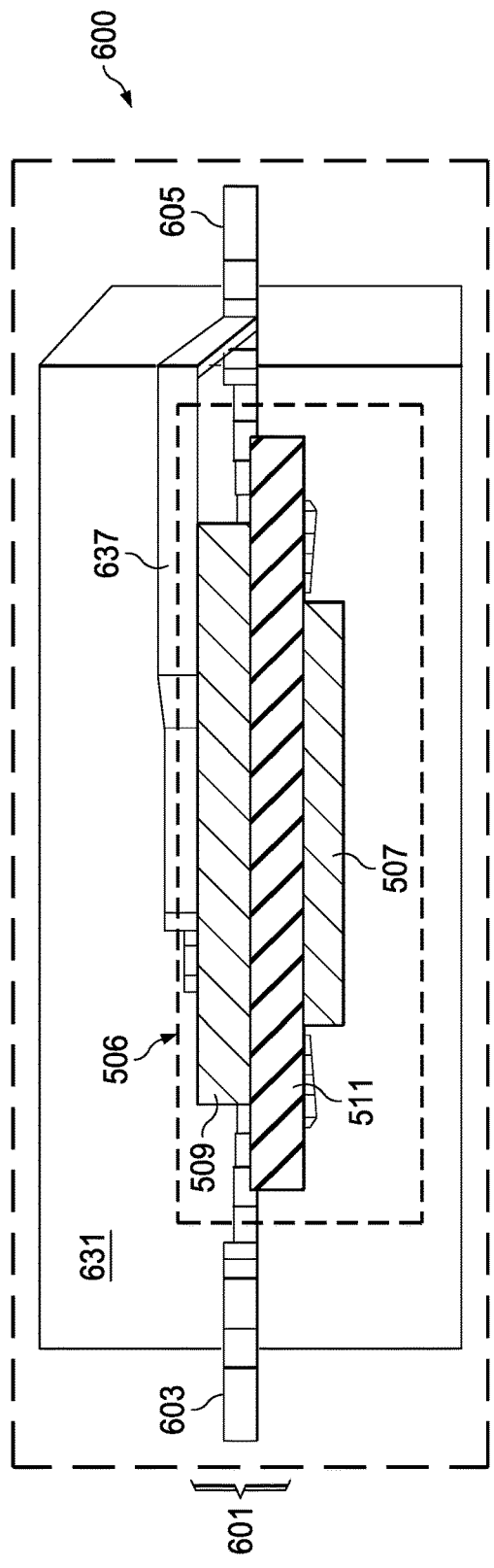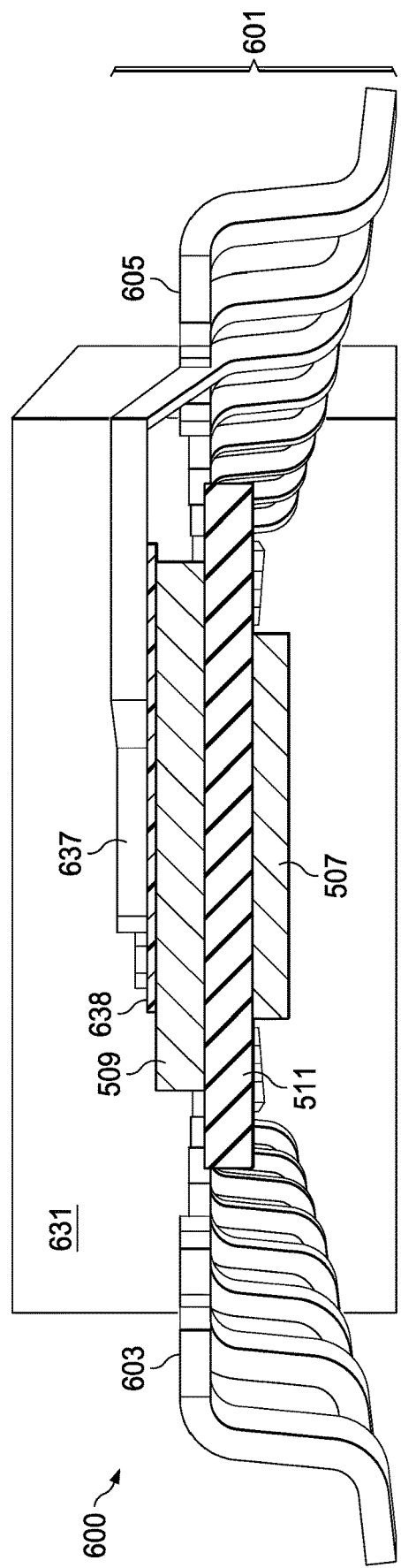

INTEGRATED SEMICONDUCTOR DEVICE ISOLATION PACKAGE

TECHNICAL FIELD

This relates generally to packaging semiconductor devices, and more particularly to packaging semiconductor devices with integrated isolation between the semiconductor devices.

BACKGROUND

For integrated semiconductor devices with internal isolation in a device package, semiconductor devices are connected across an isolation barrier. For example, a transformer formed of inductors having coils spaced by an isolation dielectric layer enables the transmission of power across isolated components, without direct connection. An example includes a DC-DC converter where a transformer driver semiconductor die receives an input voltage that is used to drive a first inductor, a second inductor receives the electromagnetic energy from the first inductor and is coupled to a rectifier semiconductor die that outputs a DC voltage proportional to the input energy. The two semiconductor dies are coupled to electrically isolated power and ground terminals. In an example, the two semiconductor dies are mounted on isolated portions of a package substrate, and a transformer including two inductors and an isolation dielectric layer between the two inductors is also mounted on the package substrate and is electrically isolated from the two semiconductor devices. The transformer can be a laminate structure with an isolation dielectric layer, the inductors having coils formed in layers of conductors spaced by dielectric laminate material on opposite sides of the isolation dielectric layer, and solder mask dielectric material may be deposited over the coils and laminates. To increase the performance of the transformer, ferrite layers can be placed outside the two coils by adhering the ferrite layers to the solder mask material. Die attach material may be used to adhere the ferrite layers to the laminate structure and over the coils.

Die attach used in a package including the laminate transformer and ferrite material described above can exhibit defects in manufacturing, including voids. These voids can cause non-uniform device performance, including partial discharge effects, resulting in scrapped semiconductor devices. Failures observed in a transformer with ferrite layers adhered to a laminate structure include partial discharge and die attach voiding. Unacceptable electromagnetic interference (EMI) between the transformer and other circuitry is also found in some transformer devices. Reliable isolation devices packaged together with semiconductor devices are needed.

SUMMARY

In a described example, an apparatus includes a transformer including: an isolation dielectric layer with a first surface and a second surface opposite the first surface; a first inductor formed over the first surface, the first inductor comprising a first layer of ferrite material, and a first coil at least partially covered by the first layer of ferrite material; and a second inductor formed over the second surface, the second inductor comprising a second layer of ferrite material and a second coil at least partially covered by the second layer of ferrite material.

BRIEF DESCRIPTION OF THE DRAWINGS

FIGS. 6A-6F illustrate, in a series of plan views and cross sectional views, selected steps in forming a packaged semiconductor device including a transformer of the arrangements.

DETAILED DESCRIPTION

Figure 1:
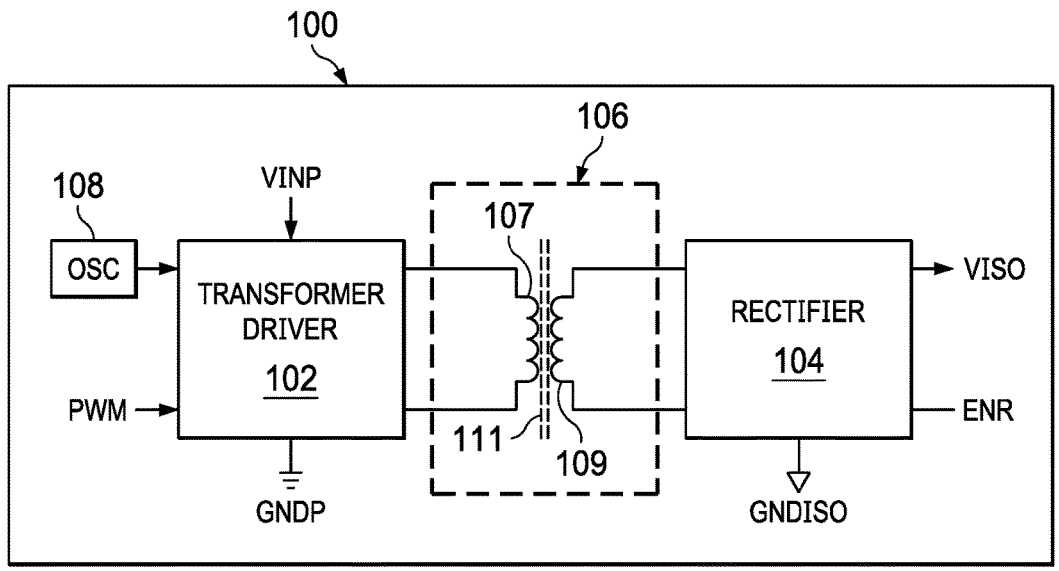
FIG. 1 illustrates in a circuit diagram a transformer in a DC-DC circuit with isolation.

Corresponding numerals and symbols in the different figures generally refer to corresponding parts, unless otherwise indicated. The figures are not necessarily drawn to scale.

Elements are described herein as "coupled." As used herein, the term "coupled" includes elements that are directly connected, and elements that are electrically connected even with intervening elements or wires are coupled.

The term "semiconductor die" is used herein. As used herein, a semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor die can include passive devices such as resistors, inductors, filters, or can include active devices such as transistors. The semiconductor die can be an integrated circuit with hundreds or thousands of transistors coupled to form a functional circuit, for example a microprocessor or memory device. The semiconductor die can be a passive device such as a sensor, example sensors include photocells, transducers, and charge coupled devices (CCDs). The semiconductor device can be a micro electro-mechanical system (MEMS) device, such as a digital micromirror device (DMD). Semiconductor dies for power applications include a discrete power transistor, a gate driver to operate the power transistor, passives such as capacitors, inductors, and resistors needed to implement power circuitry, and intelligent power devices that include protective sensors such as inrush current sensors that add reliability and control to the system. In some applications, these devices may be fabricated of different semiconductor materials, and can be separate semiconductor dies that are mounted in a single device package. In the arrangements, a semiconductor die includes a temperature sensor.

The term "packaged electronic device" is used herein. A packaged electronic device has at least one semiconductor die electronically coupled to terminals and has a package body that protects and covers the semiconductor die. In some arrangements, multiple semiconductor dies can be packaged together. For example, a power metal oxide semiconductor (MOS) field effect transistor (FET) semiconductor die and a second semiconductor die (such as a gate driver die or controller device die) can be packaged together to from a single packaged electronic device. Additional components such as passives can be included in the packaged electronic device. The semiconductor die is mounted to a package substrate that provides conductive leads, a portion of the conductive leads form the terminals for the packaged electronic device. The semiconductor die can be mounted to the package substrate with an active device surface facing away from the package substrate and a backside surface facing and mounted to the substrate. Alternatively, the semiconductor die can be flip-chip mounted with the active surface facing the substrate surface, and the semiconductor die is mounted to the leads of the substrate by conductive columns or solder balls. The packaged electronic device can have a package body formed by a thermoset epoxy resin in a molding process, or by the use of epoxies, plastics, or resins that are liquid at room temperature and are subsequently cured. The package body may provide a hermetic package for the packaged electronic device. The package body may be formed in a mold using an encapsulation process, however, a portion of the leads of the substrate are not covered during encapsulation, these exposed lead portions provide the exposed terminals for the packaged electronic device.

The term "package substrate" is used herein. A package substrate is a substrate arranged to receive a semiconductor die and to support the semiconductor die in a completed semiconductor package. Package substrates include conductive lead frames, which can be formed from copper, aluminum, stainless steel and alloys such as Alloy 42 and copper alloys. The lead frames can include a die pad for mounting the semiconductor die, and conductive leads arranged proximate to the die pad for electrical connections coupling to bond pads on the semiconductor die using wire bonds, ribbon bonds, or other conductors. The lead frames can be provided in strips or arrays. Dies can be placed on the strips or arrays, the dies placed on a die pad for each packaged device, and die attach or die adhesive can be used to mount the dies to the lead frame die pads. Wire bonds can couple bond pads on the semiconductor dies to the leads of the lead frames. After the wire bonds are in place, a portion of the substrate, the die, and at least a portion of the die pad can be covered with a protective material such as a mold compound.

Alternative package substrates include pre-molded lead frames (PMLF) and molded interconnect substrates (MIS) for receiving semiconductor dies. These substrates can include dielectrics such as liquid crystal polymer (LCP) or mold compound and can include one or more layers of conductive portions in the dielectrics. The lead frames can include plated, stamped and partially etched lead frames, in a partially etched lead frame, two levels of metal can be formed by etching a pattern from one side of the metal lead frame, and then from the other side, to form full thickness and partial thickness portions, and in some areas, all of the metal can be etched to form openings through the partial etch lead frames. Repeated plating and patterning can form multiple layers of conductors spaced by dielectrics, and conductive vias connecting the conductor layers through the dielectrics, the dielectrics can be mold compound. The package substrate can also be tape-based and film-based substrates carrying conductors; ceramic substrates, laminate substrates with multiple layers of conductors and insulator layers; and printed circuit board substrates of ceramic, fiberglass or resin, or glass reinforced epoxy substrates such as FR4.

The term "quad flat no-lead" or "QFN" is used herein for a device package. A QFN package has leads that are coextensive with the sides of a molded package body and the leads are on four sides. Alternative flat no-lead packages may have leads on two sides or on one side. These can be referred to as "small outline no-lead" or "SON" packages. No lead packaged electronic devices can be surface mounted to a board. Leaded packages can be used with the arrangements where the leads extend away from the package body and are shaped to form a portion for soldering to a board. A dual in line package, or "DIP", can be used with the arrangements. A thin DIP package arranged with leads for surface mounting can be referred to as a small outline integrated circuit or "SOIC" package.

The term "isolation dielectric layer" is used herein. An isolation dielectric layer as used herein is a layer of dielectric material that has a dielectric constant K that is greater than that of silicon dioxide, a so called "high K" dielectric material. In an arrangement, an isolation dielectric layer of material is a core of a transformer, with inductor coils formed on either side of the isolation dielectric layer. In an example an organic substrate such as flame retardant 4 (FR4) material is used as an isolation dielectric layer. Alternative isolation dielectrics for use in the arrangements include printed circuit board materials, such as bismaleimide triazine resin (BT) resin, epoxies, resins, tapes and films. In some transformers a core of metal is provided within the isolation dielectric layer.

In the arrangements, a magnetic material is used that is formed with integral inductors having conductive coils that are arranged to form a transformer. The transformer has an isolation dielectric layer that forms a central core, with the magnetic material (ferrite material) and integral inductors formed on opposite sides of the isolation dielectric layer, so that the transformer provides electrical isolation between the devices that are coupled to the inductors. The coils of the inductors have the ferrite material between the coils, in some examples the coils are formed within the ferrite material or on a surface covered by the ferrite material. In an application, the transformer is used with a pulse width modulation (PWM) transformer driver and a rectifier to provide a DC-DC converter with electrical isolation. The transformer provides a DC-DC converter with isolation between an input voltage supply and an output voltage for supplying a DC voltage to a load. The transformer driver and the rectifier can be implemented as discrete semiconductor dies. The DC-DC converter can be arranged as a packaged semiconductor device including a package substrate with isolated die mounting pads for the transformer driver, the transformer, and the rectifier. The transformer enables coupling of a DC input voltage to a DC output voltage across an isolation barrier. Magnetic energy transfers current supplied from the transformer driver coupled to a first inductor to a rectifier coupled to a second inductor, the inductors are formed on opposite sides of the isolation dielectric layer. The rectifier outputs a DC voltage generated from the current flowing in the second coil, so that a DC voltage is transferred from an input voltage supply to the output without a direct connection.

In the arrangements, use of inductors formed by coils that are formed integral with the ferrite material improves circuit performance and eliminates the die attach void defects of transformers formed by adhering layers of ferrite materials to laminated inductor structures where the inductors are made within the laminate. Integrating the inductor coils with the ferrite material makes the magnetic material an active component in the circuit, instead of being a passive layer that is placed around a transformer circuit. To form the coils, the magnetic material can be used with laser directed structuring processes to form one or more conductor layers in a build up process forming ferrite layers and coils. In another approach, the coils can be formed using laminates of ferrite layers over and between coils formed in conductor layers. In another approach, a magnetic mold compound be used with coil structures to form inductors using the magnetic mold compound formed over and between the coils.

FIG. 1 is a circuit block diagram for a DC-DC converter 100 that is one example of an application for an arrangement. Other circuits that employ transformers can be used with the transformers of the arrangements, for example in isolated signaling device between transceiver devices operating at different voltage potentials. Power supply circuitry including AC isolation, DC-DC converters, and load protection circuitry can be used with the arrangements.

In FIG. 1, a DC input voltage VINP and a corresponding ground GNDP are supplied to a transformer driver 102. The transformer driver 102 is coupled to a first inductor 107 in transformer 106. An isolation dielectric 111 is formed between the first inductor 107 and a second inductor 109. An oscillator 108 is shown supplying a time varying signal such as a clock signal to transformer driver 102, alternatively a pulse width modulation signal PWM can be input form an external circuit to transformer driver 102. In an example, when the input signal PWM is present, the output of the oscillator OSC 108 is not used. By varying the duration that the time varying signal is at a high voltage (varying the duty cycle, or modulating the pulse width, the signal frequency, or both) the current supplied to the first inductor 107 can be controlled, and the output voltage VISO from rectifier 104 can be varied and controlled. In an example, the DC-DC converter 100 can be in a single semiconductor device package, but in other examples, some of the elements can be in different packages. For example, the transformer 106 could be packaged as a component alone, or with either the transformer driver 102, or with rectifier 104, while the remaining component could be packaged as another packaged semiconductor device.

Figure 2:
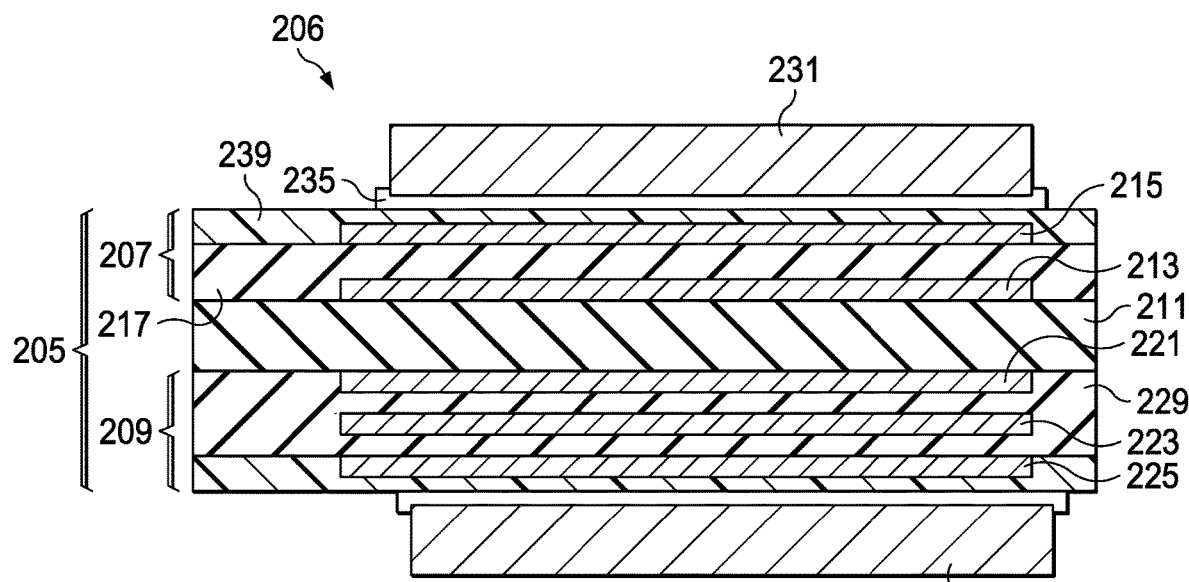
FIG. 2 illustrates in a cross sectional view a transformer including inductors formed with coils in a laminate over an isolation core, with ferrite material adhered to the outside of the laminate.

FIG. 2 illustrates, in a cross sectional view, details of an example transformer 206. In FIG. 2, an isolation dielectric layer 211 forms a core for a laminated structure 205. The isolation dielectric layer 211 can be a fiber reinforced epoxy such as flame retardant 4 (FR4), for example. Inductor 207 is formed from planar coils 213, 215 formed on conductor layers that are spaced from one another by additional dielectric layers 217. In example of a laminated structure 205, the dielectric layers 217 can be formed from "prepreg" materials, which are mats of fiber or cloth that are impregnated with a resin or epoxy to form dielectric layers. Inductor 207 is over a first surface of the isolation dielectric layer 211. Inductor 209 is over an opposing second surface of the isolation dielectric layer 211. The inductor 209 is formed with conductor layers similar to those for inductor 207, planar coils 221, 223, 225 are spaced from one another by dielectric layers 229. The conductor layers that form the inductors 207, 209 can be formed of conductive foils, such as copper, that are applied to first and second opposite surfaces of the isolation dielectric layer 211, and which are then patterned using photolithography pattern and etch processes, for example, to form spiral, rectangular, octagonal, square, circular or other shapes for planar coils, and the inductors 207, 209 can include conductors in one level or in multiple levels as shown FIG. 2. Inductor 207 is on a first surface of the isolation dielectric layer 211, and inductor 209 is on an opposite second surface and is isolated from the inductor 207 by the isolation dielectric layer 211.

Magnetic material in the form of ferrite layers 231, 233 is attached to the laminate structure 205 by die attach 235, which can be a non-conductive die attach film (NCDAF), for example. Die attach pastes and epoxies can be used. The NCDAF 235 is adhered to a protective solder mask layer 239 deposited over the outer surfaces of laminate structure 205. In an example the ferrite layers 231, 233 can be an iron oxide, nickel, zinc composition in a flexible film such as polyester or polymer film, or in another ferrite containing material. The ferrite layers 231, 233 are placed over the coils such as 215, 225 and improve the performance of the transformer 206 by containing the magnetic flux and improving the magnetic coupling between the inductors 207, 209. Defects occur in the transformer 206 when voids in the die attach material 235 form in manufacture between the ferrite layers 231, 233 and the laminate structure 205. The voids cause a non-uniform dielectric layer, and partial discharge has been observed during testing of the transformer, resulting in scrapped devices.

Figure 3:
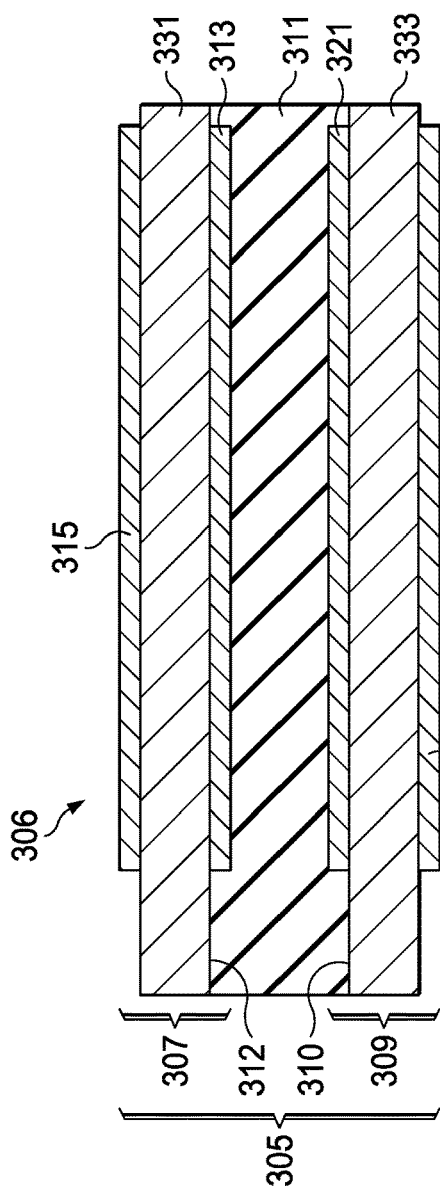
FIG. 3 illustrates in a cross sectional view a transformer of an arrangement.

FIG. 3 illustrates, in a cross sectional view, a transformer 306 of an arrangement. In FIG. 3, a laminate structure 305 includes an isolation dielectric layer 311, which can be an organic substrate such as FR4 or BT resin. Inductors 307 and 309 are formed of coils that are spaced by a layer of ferrite material. The ferrite material can be formed by an additive manufacturing process such as 3D printing, by using laser directed structuring (LDS) manufacturing with a magnetic base material, by forming a laminate structure using layers of ferrite material, or by using a magnetic mold compound that contains the ferrite material molded between layers of conductors. In LDS, a laser activates an additive material that is included in a base magnetic material, the additive including conductive particles that can be activated by laser energy. The laser activates the conductive particles within the magnetic polymer at places where the laser cuts into the material. The laser forms patterns in the base magnetic material that include conductor molecules, forming a seed layer in places where the laser has etched the material. These seed layer patterns can be plated with conductors using electroless plating. Copper or another metal which can be plated, such as gold, nickel, tin, palladium or alloys of these, can be formed by electroless plating on the laser patterns. The plating only occurs in areas where the laser patterned the surface of the magnetic material, so that etching and resist stripping steps used in other plating processes are not needed after the electroless plating. In an example, LDS can be used to form a coil pattern that is plated on opposite sides of the ferrite material, and the ferrite material can then be assembled on the isolation dielectric layer to form coils with ferrite material between the coils. In an alternative approach, a first coil pattern can be formed on a surface of the isolation dielectric layer, and magnetic mold compound can be deposited over the first coil pattern. A second coil pattern can be formed over the magnetic mold compound to complete the inductor structures, resulting in an inductor with coils spaced from one another by the ferrite layer and on opposing sides of a ferrite layer. Copper coils can be applied to a surface of the isolation dielectric layer 311, and to the ferrite layers 331 and 333. The copper can be patterned and the layer then stacked over the coils in a laminate assembly process. The ferrite layers 331, 333 can be formed of magnetic mold compound that is applied over planar coils formed on the isolation dielectric layer 311, and then after a curing process, an additional coil can be formed on the outer surface of the ferrite layers.

The isolation dielectric layer 311 in FIG. 3 has a first surface 312 and an opposite second surface 310. An inductor 307 is formed over the first surface, having a first coil 313 formed over the first surface, and a ferrite layer 331 is formed over the first coil. A second inductor 309 is formed over the second surface 310, and has a second coil 321 over the second surface, and a second ferrite layer 333 over the second coil 321. A third coil 315 can be formed over the first ferrite layer and coupled to the first coil 313, to form a first inductor 307 with two coils spaced by ferrite lyre 331. A fourth coil 325 can be formed over the second ferrite layer 333 and coupled to the second coil 321, to form the second inductor 309 with two coils spaced by ferrite layer 333.

In FIG. 3, the coils 313, 315, and 321, 325, are on either side of the ferrite material 331, 333. By forming the transformer 306 using coils integrated with the ferrite material, the performance of transformer 306 is improved (when compared to a transformer where ferrite layers are simply adhered to a laminated structure transformer with coils formed in dielectric layers.) Because the ferrite material lies between and in some arrangements surrounds the conductive coils of the inductors, in the arrangements the ferrite material becomes an active circuit component, instead of being a passive layer applied to a circuit component. Further, the problems with adhering ferrite layers to a laminate structure using a die attach material and the die attach voids and defects that occur in laminate transformer manufacture are eliminated with use of the arrangements, as the inductor coils are formed along with the ferrite material.

Figure 4:
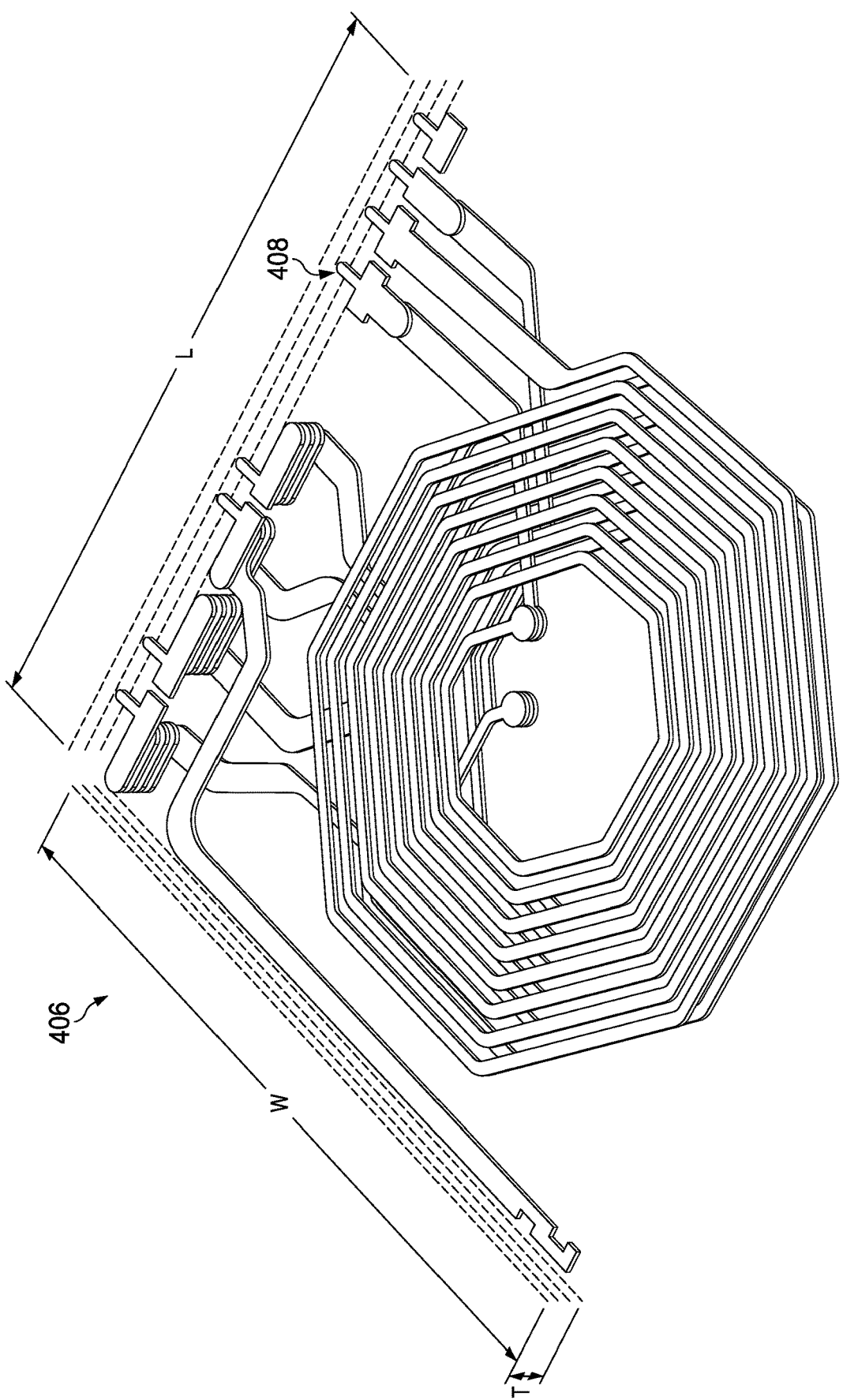
FIG. 4 illustrates in a projection view details of coils for inductors forming a transformer useful with the arrangements.

FIG. 4 illustrates, in a projection view, the conductive portion of coils used to form the inductors for a transformer such as transformer 406 that is useful with the arrangements. In FIG. 4, the conductor material is shown without the ferrite material or the isolation dielectric layer, for clarity. In FIG. 4, a transformer 406 has overlying inductors, with multiple levels of coils, the inductors are spaced apart vertically. The coils in the transformer 406 of FIG. 4 are spiral patterns with straight sides in an octagonal shape, however other shapes including circular, square, rectangular, other multiple sided shapes, oval, round, and zig-zag shapes can be used. The number of conductor levels is variable as well, in the illustrated example an upper inductor has two levels, while a lower inductor (obscured in FIG. 4) has three levels, the design of transformers with variable gain can be done by varying the number of planar coils used for each inductor. In an example arrangement, the transformer has a width W of about 4 millimeters, a length L of about 5 millimeters, and a thickness T of about 0.4 millimeters. However, the example dimensions can also be varied with the application, and with the processes and materials used.

Figure 5:
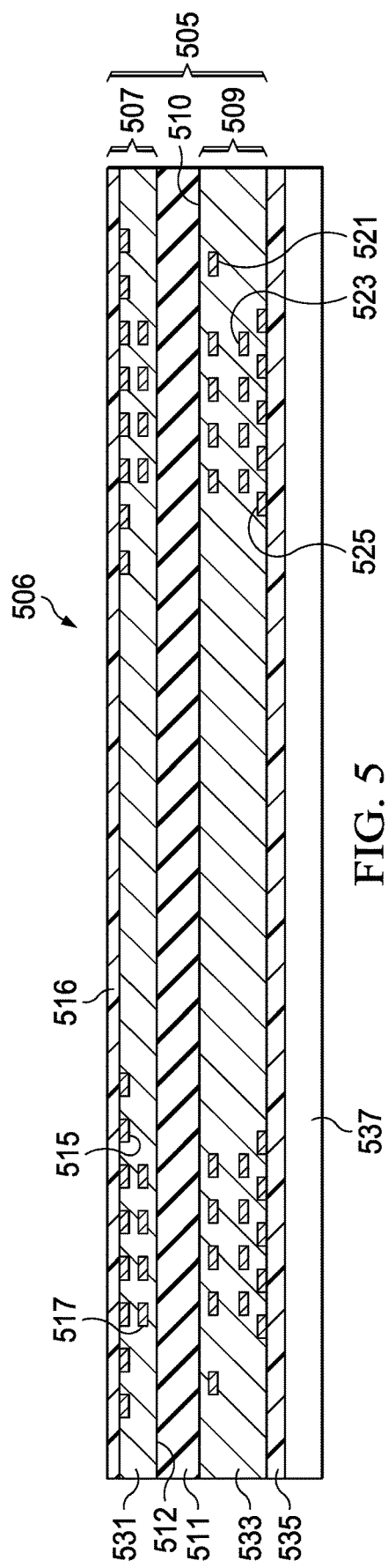
FIG. 5 is a cross sectional view of a transformer of an arrangement.

FIG. 5 illustrates in a cross sectional view a transformer structure 506 that is useful with an arrangement. In FIG. 5, a structure 505 includes inductors 507 and 509 formed integrally with ferrite layers 531 and 533. The ferrite layers 531 and 533 are provided on a first surface 512 and a second opposite surface 510 on an isolation dielectric layer 511. Isolation dielectric layer 511 can be an FR4 substrate, for example. The first inductor 507 has first coil 515 and a third coil 517 spaced from the first coil by ferrite layer 531. A protective solder mask layer 516 overlies the outer surface of inductor 507. The second inductor 509 has a second coil 521 and a fourth coil 525 spaced apart by ferrite layer 533, and a fifth coil 523 within the ferrite layer 533. The outer surface of the inductor 509 is covered by a solder mask layer 535. A die attach layer 536 attaches the transformer 506 to a die pad 537. The die attach is a non-conductive die attach film (NCDAF), epoxy or paste, and electrically isolates the transformer 506 from the die pad 537.

Figure 6A:
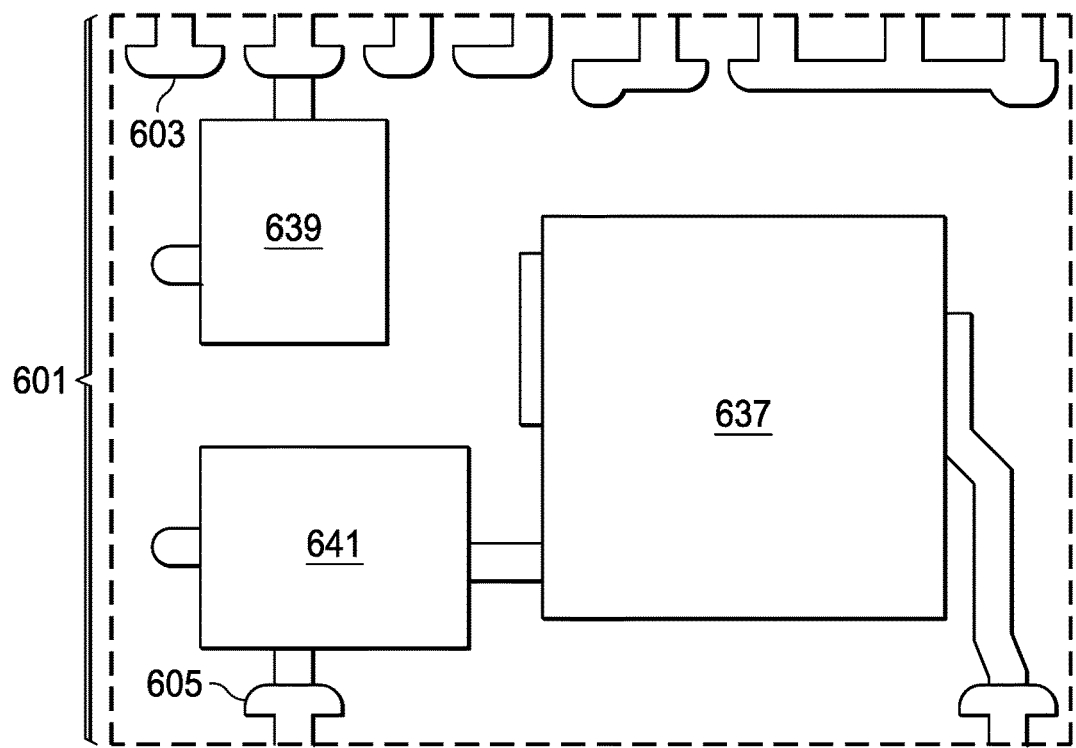

FIGS. 6A-6F illustrate, in a series of plan views and cross sections, steps for forming an arrangement. In FIG. 6A, a portion of a package substrate 601 is shown in a plan view. Note that the leads 603, 605 are not shown in full in FIGS. 6A-6E for ease of illustration, but the leads are shown in full for FIG. 6F. The package substrate 601 can be, for example, a conductive leadframe, other package substrates such as PMLF, routable leadframes, and MIS substrates can be used. The package substrate 601 has die pads 639, 641 that are spaced from one another, these will be used to mount semiconductor dies that are electrically isolated from one another. A larger die pad 637 is shown, this die pad will be used to mount a transformer using non-conductive die attach, to isolate the transformer. In an example, the larger die pad 637 is a first die pad and the die pads 639, 641 are second and third die pads for an arrangement.

Figure 6B:
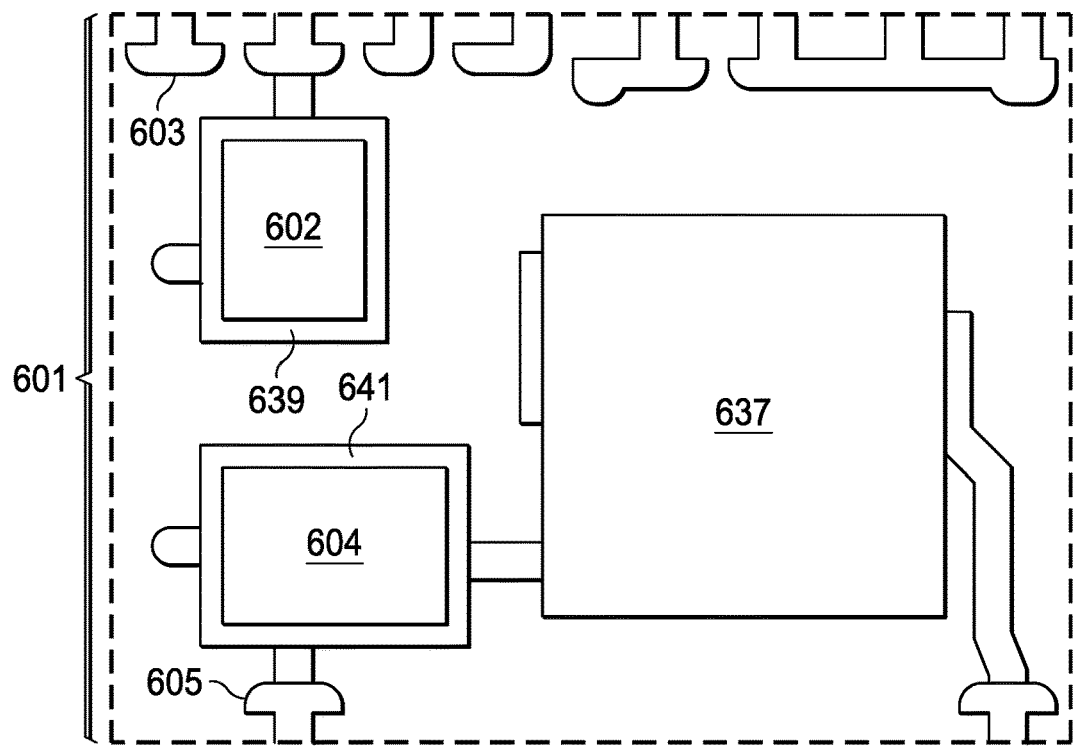

FIG. 6B illustrates in another plan view the package substrate 601 of FIG. 6A after additional processing. In FIG. 6B, a first semiconductor die 602, and a second semiconductor die 604, which can be for example a transformer driver semiconductor die and a rectifier semiconductor die, are shown mounted on the die pads 639, 641. A die attach film, for example a conductive die attach film (not visible) can be used to mount the semiconductor dies 602, 604 to the respective die pads 639, 641. A die attach cure process, such as use of a thermal oven, rapid thermal processing using halogen lamps, ultra-violet UV) cure, or another cure process can be used depending on the die attach material selected, to cure the die attach. In alternatives to die attach film, die attach paste, epoxy or other die attach materials used in semiconductor processing can be used. Leads 603 are in the same voltage domain as die 602, while leads 605 are in the same voltage domain as die 604, one of the leads 603 is in electrical contact with the die pad 639, while one of the leads 605 is in electrical contact with die pad 641.

Figure 6C:
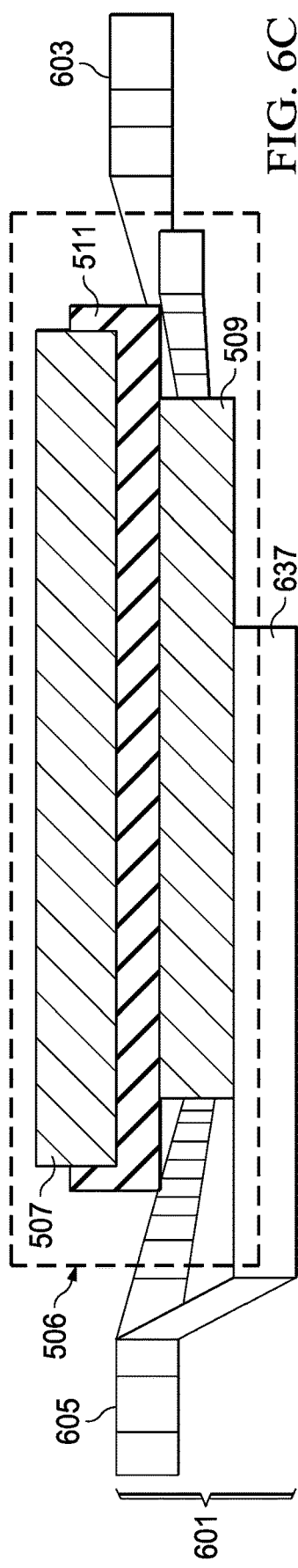

FIG. 6C illustrates, in a cross sectional view, the package substrate 601, the die pad 637, and a transformer 506 (see FIG. 5) that is mounted to the die pad 637. The transformer 506 includes the inductors 507, 509 mounted on opposite surfaces of the isolation dielectric layer 511. The isolation dielectric 511 layer also includes bond pads (not shown), so that electrical connections such as bond wires can be made coupling to the transformer 506, and to the coils (not visible) within the inductors 507, 509. A non-conductive die attach film (not shown for clarity of illustration) is used to mount the transformer 506 to the die pad 637, see FIG. 5, 535.) The non-conductive die attach film can be cured using thermal energy, rapid thermal processing using halogen lamps, UV cure, or time cure depending on the material used. In an alternative, pastes and epoxies that are non-conductive die attach materials can be used. The non-conductive die attach film provides an electrical isolation between the transformer 506 and the die pad 637, while providing a thermal dissipation path from the transformer to the package substrate 601.

The die pad 637 in FIG. 6C is shown with a "downset" feature which lies below a plane formed by the leads 603, 605 in FIG. 6C. This example is but one possible arrangement for the package substrate 601. The downset die pad 637 may help keep a completed semiconductor package within a certain package thickness, by making efficient use of the vertical space between the elements. Inductors 507, 509 include the ferrite materials and the coils as shown in FIG. 5, these are not shown in FIG. 6C, for simplicity of illustration. The inductors 507, 509 can be of smaller area than the isolation dielectric layer 511, which provides spacing for routing traces to bond pads on isolation dielectric layer 511, which will be used for connections between the transformer 506 and other components.

Figure 6D:
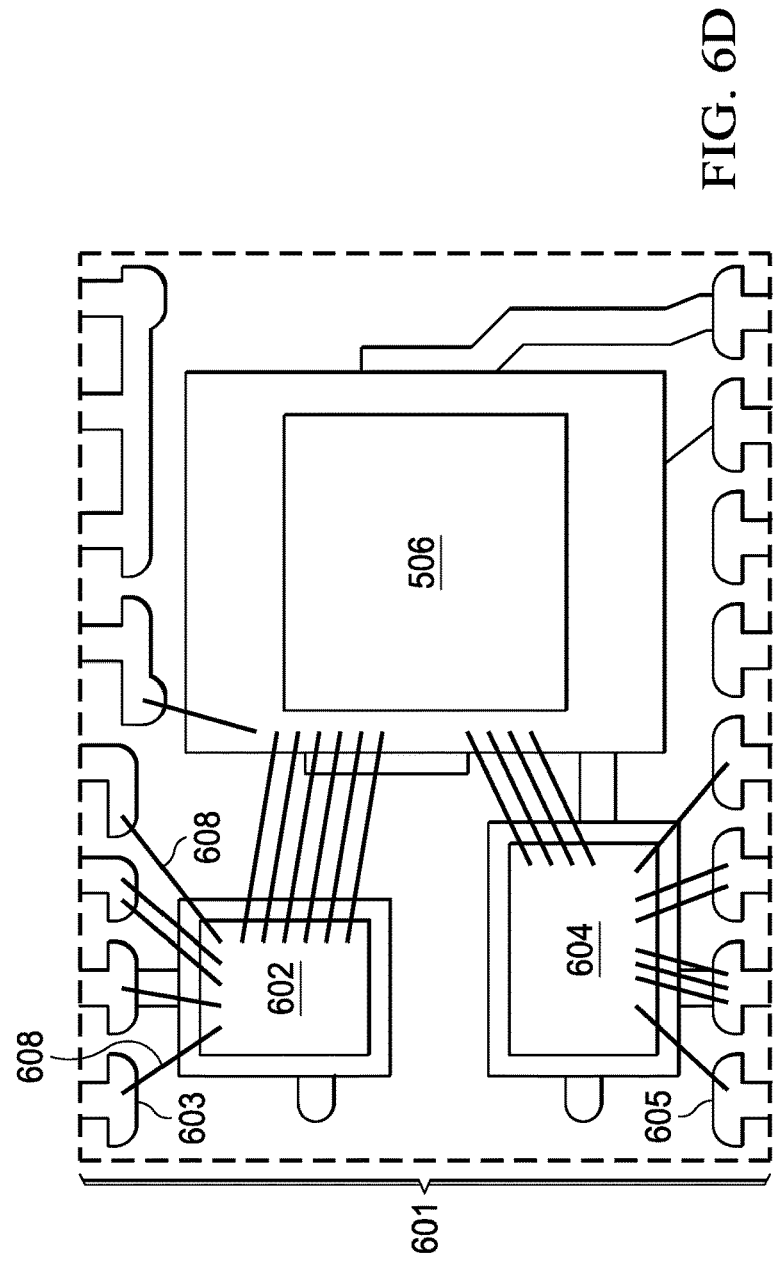

FIG. 6D illustrates, in a plan view, the package substrate 601 of FIG. 6C after additional processing. In FIG. 5D, the package substrate 601 is shown after the semiconductor dies, the transformer, and the package substrate are subjected to a cleaning process to remove any unwanted material such as die attach or oxides, and after a wire bonding operation forms bond wires 608 coupling bond pads on the semiconductor dies to leads of the package substrate, or to bond pads on the transformer isolation dielectric layer. In a wire bonding operation, a wire bonding tool has a capillary with bond wire running through it. At bond ball is formed at the end of the wire on the capillary using a flame or heat to form the ball. The bond ball is bonded to a bond pad using pressure, sonic energy, or a combination of these. As the capillary of the wire bonding tool moves away from the bond ball, which is now adhered to a bond pad, the bond wire extends through the capillary in an arc shape. The capillary then forms a second bond by pressure on the wire, which is cut or broken, to form a stitch bond on another bond pad. This process is referred to as "ball and stitch" bonding. The bond wires then electrically connect the two bond pads. This process is rapidly repeated in an automated wire bonding tool to form the bond wires 608 connecting the semiconductor dies 602, 604 to the leads 603, 605 of the package substrate 601, or to the transformer 506. Ribbon bonds can be used as an alternative to wire bonding. The bond wires can be copper, gold, palladium coated copper (PCC), or aluminum.

FIG. 6E illustrates, in a partial cross sectional view, the arrangement of FIG. 6D after further processing. In the illustrated example, the package substrate is inverted after wire bonding, and prior to a molding process, but the package substrate could be molded with the original orientation, as well. The leads 603, 605 are shown partially and are not fully illustrated in FIG. 6E, but see the full leads 603, 605 in FIG. 6F. In FIG. 6E, a packaged semiconductor device 600 is shown that includes the transformer 506 with isolation dielectric layer 511 and inductors 509, 507, covered in a mold compound 631. Semiconductor dies 602, 604, and a portion of the leads 603, 605 are also covered with mold compound 631, the semiconductor dies 602, 604 are not visible in the cross section of FIG. 6E. To form the packaged semiconductor device 600, a thermoset resin epoxy mold compound can be used. The packaged device can be formed in a block molding or transfer molding process. A solid puck or powdered mold compound can be heated to a temperature where it transitions to a liquid state, and then the liquid mold compound can be forced under pressure in a mold tool to cover, or encapsulate, the package substrate 601 including portions of the leads 603, 605, the transformer 506, and the semiconductor dies 602, 604 (not shown). The mold compound 631 can then be cured and cooled to a solid state to complete the semiconductor device package 600. While a single packaged device 600 is shown in FIG. 6E for ease of explanation, in a production facility the package substrate 601 can include an array of package substrate units arranged in rows and columns. For each unit, a transformer, and the transformer driver semiconductor die, and the rectifier die, will be mounted to die pads on the package substrates, which can be a copper or other metal leadframe. Each unit is wire bonded to complete the electrical connections, and each unit is then encapsulated with mold compound. By processing many units simultaneously in a packaging operation, volume is increased and per unit costs are lowered.

FIG. 6F illustrates, in another cross sectional view, the packaged semiconductor device 600 of FIG. 6E after additional processing. In FIG. 6F the leads 603, 605, are shaped in a trim form process. In the trim process, package substrate material between the leads (sometimes referred to as tie bars, or dam bars) is removed after the molding process, this excess lead material stabilizes the leads during wire bonding and molding, but is now trimmed so that the leads are electrically isolated from one another. The leads are then formed. In the example of FIG. 6F, the leads are formed to create the "gull wing" shapes used in certain types of leaded packages, alternatively other lead shapes, such as J-lead or DIP lead shapes, can be used. The transformer 506 is mounted to the die pad 637 by a non-conductive die attach film 638. The inductors 507, 509 which include the coils and the ferrite layers shown in FIG. 5, for example, are isolated from one another by the isolation dielectric layer 511, and are further isolated from the package substrate 601 by the non-conductive die attach film 638.

Figure 7:
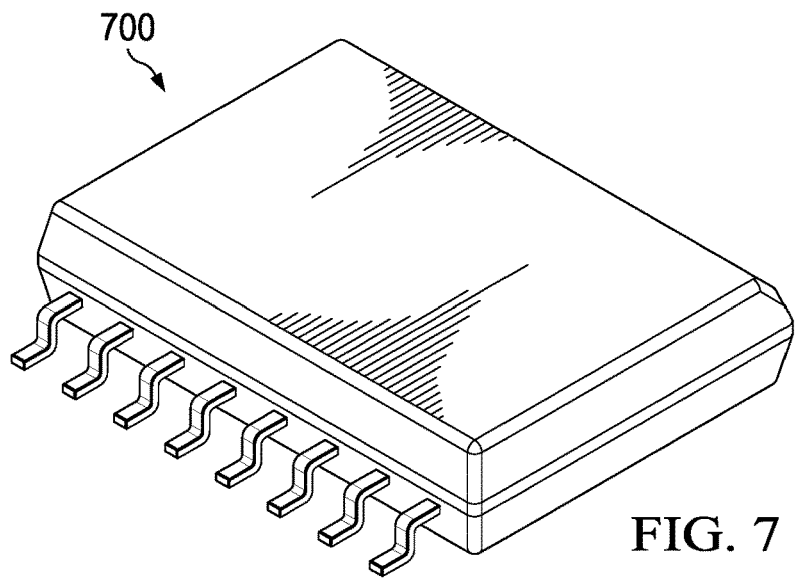
FIG. 7 is a projection view of a small outline integrated circuit (SOIC) semiconductor device package useful with the arrangements.

FIG. 7 illustrates, in a projection view, an example semiconductor device package that can be used with an arrangement. In FIG. 7, semiconductor device package 700 is a leaded package such as a small outline integrated circuit (SOIC) package. Package 700 has leads that are shaped and arranged for a board mounting using solder to attach the package 700 to traces on a system board. No lead packages, such as quad flat no lead (QFN) packages, or small outline no lead (SON) packages, can also be used with the arrangements.

Figure 8:
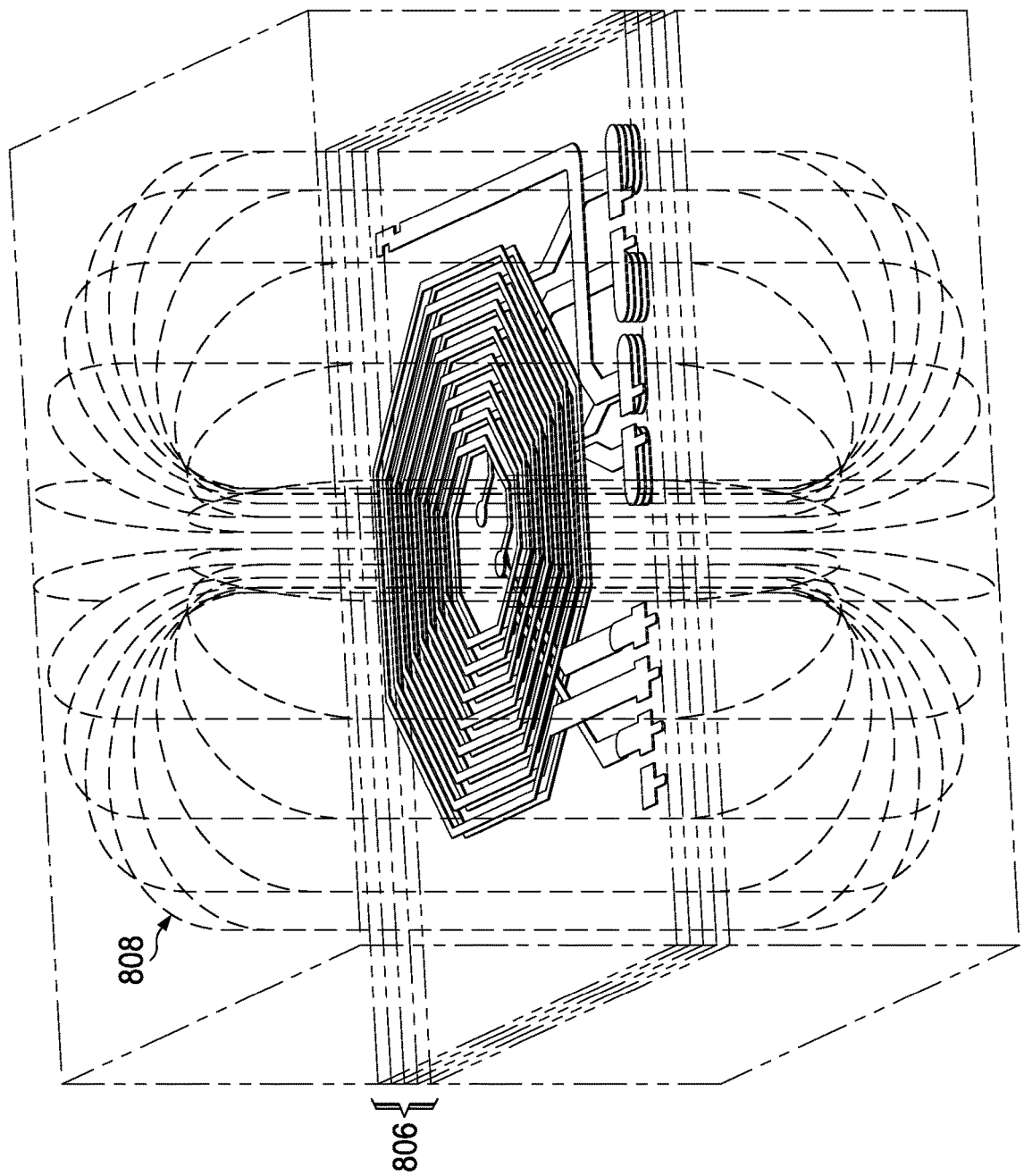
FIG. 8 illustrates in a projection view the magnetic field density obtained in a simulation of a transformer of an arrangement.

FIG. 8 illustrates in a projection view the results of a simulation of a transformer of the arrangements. In FIG. 8 the magnetic flux density is plotted in lines 808 on the projection view for a transformer 806 that is similar to transformer 406 in FIG. 4, with the inductor coils formed with ferrite material between the coils. As shown in FIG. 8, the magnetic flux density liens 808 indicate efficient coupling between the inductors, as the magnetic flux density is stronger in the central portion of the transformer, and the magnetic flux is contained close to the transformer, so that EMI from the device is minimized. When compared to transformers formed without the use of the arrangements, a transformer made using the arrangements has a 30% increase in coupling efficiency between the inductors. In addition, use of the arrangements reduces or eliminates the die attach void defects observed between the ferrite layers and the inductors, which occurs when ferrite material is adhered to the outside of a transformer having coils formed in a dielectric laminate structure.

Figure 9:
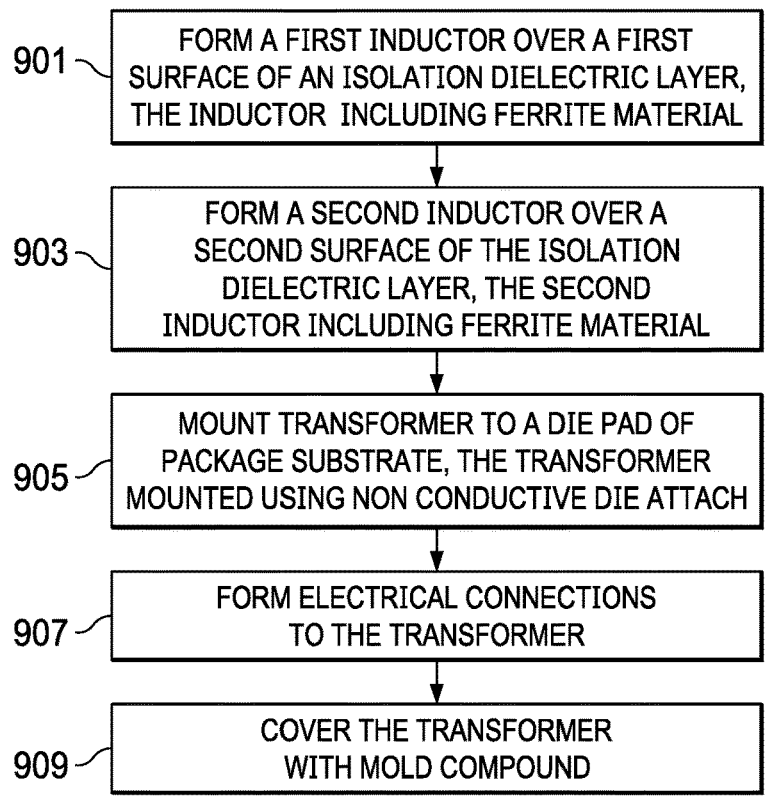
FIG. 9 illustrates, in a flow diagram, steps for forming an arrangement.

FIG. 9 illustrates, in a flow diagram, a method for forming an transformer of the arrangements. In step 901, a first inductor is formed over a first surface of an isolation dielectric layer (see FIG. 5, isolation dielectric layer 511, and inductor 507). The first inductor includes at least one coil in a conductor layer, and can include multiple coils in multiple conductor layers (see coil 517, and ferrite layer 531, in FIG. 5). Ferrite material covers at least a portion of the conductor layer. When multiple coils in multiple conductor layers are used, ferrite material is between the spaced coils (see first coil 517 and third coil 515 in inductor 507, in FIG. 5)

At step 903, a second inductor is formed over a second surface of the isolation dielectric layer (see isolation dielectric layer 511, second inductor 509, in FIG. 5). The second inductor includes at least a second coil in a conductor layer (see second coil 521 in FIG. 5). The second inductor includes ferrite material that covers at least a portion of the conductor layer (see ferrite layer 533 in FIG. 5). The second inductor can include multiple coils in conductor layers spaced by ferrite material (see coils 533, 535 in ferrite layer 533 in FIG. 5).

At step 905, the first inductor, isolation dielectric layer, and second inductor are mounted to a die pad of a package substrate. In an example, the die pad can be a portion of a metal leadframe, such as a copper leadframe. (see FIG. 6E, transformer 506, on die pad 637).

At step 907, electrical connections are made to the inductors (see bond wires 608 in FIG. 6D). In an example, wire bonding is used to form bond wires coupled to the first inductor and to the second inductor, while the first inductor and the second inductor are electrically isolated from one another by the isolation dielectric layer. Alternative electrical connections include ribbon bonding.

At step 909, mold compound is used to cover the transformer including the first inductor, the isolation dielectric layer, and the second inductor, to form a packaged semiconductor device (see 600 in FIG. 6E, FIG. 6F). In some arrangements, additional semiconductor dies can be mounted to the package substrate and packaged with the transformer, for example a transformer driver semiconductor die, and a rectifier semiconductor die, can be packaged with the transformer.

In example arrangements, ferrite material and coils are used in an integral assembly to form inductors for a transformer. The inductors can be formed, in one example process, using a laminate structure with ferrite material between the coils. A first coil can be formed by patterning a conductor layer on an isolation dielectric layer. Magnetic prepreg material layers including ferrite can be applied over the first coil, to provide the magnetic material. A second coil can be formed on the ferrite prepreg, by patterning second layer of conductor material. The two coils form an inductor, with the ferrite material between the two coils. The inductor can be arranged on one surface of the isolation dielectric layer, with a second inductor formed in the same manner arranged on an opposite surface of the isolation dielectric layer, to form a transformer.

In an alternative arrangement, the inductors can be formed by using laser directed structuring to form conductive coils directly on the surfaces of ferrite material. The ferrite material has a polymer base with an additive that is arranged for forming electroless plated elements using laser directed structuring. When the additive in the ferrite material is activated by a laser etching into the surface of the ferrite material, conductive particles in the additive are activated and form a seed layer. By electroless plating of a conductor such as copper onto the seed layer, coils are formed on the ferrite material. Multiple levels of coils can be formed in this manner in a build up process, and can be coupled together to form an inductor that includes the coils spaced by the ferrite material. By forming two inductors on opposite sides of an isolation dielectric layer, a transformer is formed.

In yet another alternative arrangement, the inductors can be formed using a magnetic mold compound that includes, for example, iron oxide, nickel and zinc particles. A conductive layer on a surface of an isolation dielectric layer can be patterned to form a coil. Magnetic mold compound can be flowed over the coil and cured to form a ferrite layer over the first coil. A second coil can be formed by patterning a second conductor layer on the ferrite layer, and the coils can be coupled together to form an inductor with ferrite material between the coils. By forming two of the inductors on opposite sides of the isolation dielectric layer, a transformer can be formed.

Modifications are possible in the described arrangements, and other alternative arrangements are possible within the scope of the claims.

What is claimed is:

1. A transformer, comprising:
   an isolation dielectric layer with a first surface and a second surface opposite the first surface, a first coil of a first inductor and a first coil of a second inductor within the isolation dielectric layer;
   a first ferrite material contacting the first surface and the first coil of the first inductor; and a second ferrite material contacting the second surface and the first coil of the second inductor; and
   a second coil of the first inductor contacting the first ferrite material, and a second coil of the second inductor contacting the second ferrite material.

2. The transformer of claim 1, wherein the first ferrite material and the second ferrite material comprise a polymer containing iron, nickel and zinc.

3. The transformer of claim 1, wherein the first ferrite material and the second ferrite material comprise a polymer comprising iron oxide and an additive material configured for use in a laser directed structuring process.

4. The transformer of claim 1, wherein the first ferrite material and the second ferrite material comprise a polymer film.

5. The transformer of claim 1, wherein the first ferrite material and the second ferrite material comprise a magnetic mold compound that contains iron oxide, nickel and zinc.

6. The transformer of claim 1, wherein the isolation dielectric layer is one selected from a fiber reinforced epoxy, flame retardant 4 (FR4), and bismaleimide triazine (BT) resin.

7. The transformer of claim 1, wherein the first and the second coils of each of the first and second inductors are planar coils from a cross-sectional view of the transformer.

8. The transformer of claim 1, wherein the first and the second coils of each of the first and second inductors include an octagonal shape from a view of the transformer.

9. The transformer of claim 1, wherein the first and the second coils of each of the first and second inductors include one of a circular, square, rectangular, and oval shapes.

10. The transformer of claim 1, wherein the transformer has a width W of about 4 millimeters, a length L of about 5 millimeters, and a thickness T of about 0.4 millimeters.

11. A transformer, comprising:
    a dielectric layer with a first surface and a second surface opposite the first surface, a first coil of a first inductor and a first coil of a second inductor within the isolation dielectric layer;
    a first ferrite material including a magnetic mold compound contacting the first surface and the first coil of the first inductor; and a second ferrite material including the magnetic mold compound contacting the second surface and the first coil of the second inductor; and
    a second coil of the first inductor contacting the first ferrite material, and a second coil of the second inductor contacting the second ferrite material.

12. The transformer of claim 11, wherein the magnetic mold compound contains iron oxide, nickel and zinc.

13. The transformer of claim 11, wherein the dielectric layer is one selected from a fiber reinforced epoxy, flame retardant 4 (FR4), and bismaleimide triazine (BT) resin.

14. The transformer of claim 11, wherein the first and the second coils of each of the first and second inductors are planar coils from a cross-sectional view of the transformer.

15. The transformer of claim 11, wherein the first and the second coils of each of the first and second inductors include an octagonal shape from a view of the transformer.

16. The transformer of claim 11, wherein the first and the second coils of each of the first and second inductors include one of a circular, square, rectangular, and oval shapes.

* * * * *